(12) United States Patent  (10) Patent No.: US 9,035,723 B2
Kim et al.  (45) Date of Patent: May 19, 2015

(54) FILTER FOR REMOVING NOISE

(75) Inventors: Yong Suk Kim, Gyeonggi-do (KR);
Young Ghyu Ahn, Gyeonggi-do (KR);
Young Seuck Yoo, Seoul (KR); Jeong Bok Kwak, Gyeonggi-do (KR); Sang Moon Lee, Seoul (KR); Kang Heon Hur, Gyeonggi-do (KR); Sung Kwon Wi, Seoul (KR)

(73) Assignee: SAMSUNG ELECTRO-MECHANICS CO., LTD., Gyunggi-Do (KR)

(*) Notice: Subject to any disclaimer, the term of this patent is extended or adjusted under 35 U.S.C. 154(b) by 297 days.

(21) Appl. No.: 13/420,538

(22) Filed: Mar. 14, 2012

(65) Prior Publication Data
US 2013/0154767 A1 Jun. 20, 2013

(30) Foreign Application Priority Data

Dec. 19, 2011 (KR) .................. 10-2011-0137427

(51) Int. Cl.
*H03H 7/01* (2006.01)
*H01F 27/33* (2006.01)
*H01F 17/00* (2006.01)

(52) U.S. Cl.
CPC .......... *H03H 7/01* (2013.01); *H01F 2017/0066* (2013.01)

(58) Field of Classification Search
CPC .............. H01F 5/003; H01F 27/245; H01F 2017/0026; H01F 2017/0066; H01F 21/08; H03H 7/0115; H03H 7/01
USPC ........... 333/161, 162, 168, 175, 185; 336/177
See application file for complete search history.

(56) References Cited

U.S. PATENT DOCUMENTS

| | | | |
|---|---|---|---|
| 6,593,841 B1* | 7/2003 | Mizoguchi et al. | 336/200 |
| 6,868,258 B2* | 3/2005 | Hayata et al. | 455/81 |
| 7,719,084 B2* | 5/2010 | Gardner et al. | 257/531 |
| 2003/0201055 A1* | 10/2003 | Cho | 156/89.11 |

(Continued)

FOREIGN PATENT DOCUMENTS

| | | |
|---|---|---|
| JP | 62-115813 A | 5/1987 |
| JP | 2007-081349 A | 3/2007 |

(Continued)

OTHER PUBLICATIONS

JP 2012-092773 Office Action dated Jun. 3, 2014; 2pgs.

*Primary Examiner* — Benny Lee
*Assistant Examiner* — Gerald Stevens
(74) *Attorney, Agent, or Firm* — Bracewell & Giuliani LLP; Brad Y. Chin

(57) ABSTRACT

The present invention discloses a filter for removing noise, which includes: a lower magnetic substrate; a coil layer disposed on the lower magnetic substrate and including at least one conductor pattern and an insulating layer covering the conductor pattern; an upper magnetic substrate disposed on the coil layer; and a magnetic permeability enhancing layer disposed on the magnetic substrate with lower magnetic permeability of the lower magnetic substrate and the upper magnetic substrate.

According to the present invention, it is possible to implement a filter for removing noise with high performance, characteristics, and reliability by increasing magnetic permeability to improve impedance characteristics and improving an effect of shielding electromagnetic waves such as jamming.

16 Claims, 4 Drawing Sheets

(56) References Cited

U.S. PATENT DOCUMENTS

2007/0148347 A1* 6/2007 Hatanpaa et al. .......... 427/248.1
2009/0007418 A1* 1/2009 Edo et al. .................... 29/609

FOREIGN PATENT DOCUMENTS

| JP | 2009-182168 A | 8/2009 |
| KR | 10-2007-0032259 A | 3/2007 |

* cited by examiner

- PRIOR ART -

FILTER FOR REMOVING NOISE

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2011-0137427, entitled filed Dec. 19, 2011, which is hereby incorporated by reference in its entirety into this application.

BACKGROUND OF THE INVENTION

1. Field of the Invention

The present invention relates to a filter for removing noise, and more particularly, to a filter for removing noise that is capable of improving performance by increasing magnetic permeability and improving impedance characteristics through simple structure and process.

2. Description of the Related Art

Electronic products, such as digital TVs, smart phones, and notebook computers, have functions for data communication in radio-frequency bands. Such IT electronic products are expected to be more widely used since they have multifunctional and complex features by connecting not only one device but also USBs and other communication ports.

Here, for higher-speed data communication, data are communicated through more internal signal lines by moving from MHz frequency bands to GHz radio-frequency bands.

When more data are communicated between a main device and a peripheral device over a GHz radio-frequency band, it is difficult to provide smooth data processing due to signal delay and other noises.

Therefore, there is a need for immunity measures for preventing malfunctions due to external noises as well as preventing electronic products themselves from being noise sources.

In order to solve the above problem, an EMI prevention part is provided around the connection between an IT device and a peripheral device. However, conventional EMI prevention parts are used only in limited regions such as specific portions and large-area substrates since they are coil-type and stack-type and have large chip part sizes and poor electrical characteristics. Therefore, there is a need for EMI prevention parts that are suitable for slim, miniaturized, complex, and multifunctional features of electronic products.

A common-mode filter of EMI prevention coil parts in accordance with the prior art is described below in detail with reference to FIGS. 1.

Referring to FIG. 1, a conventional common-mode filter includes a lower magnetic substrate 10, an insulating layer 20 disposed on the lower magnetic substrate 10 and including a first coil pattern 21 and a second coil pattern 22 which are vertically symmetrical to each other, and an upper magnetic substrate 30 disposed on the insulating layer 20.

Here, although not shown in detail, the insulating layer 20 may be configured by coupling a sheet-type first insulating layer including the first coil pattern and a sheet-type second insulating layer including the second coil pattern in a stack type.

And, although not shown in detail, a first input lead pattern and a first output lead pattern for inputting and outputting electricity to and from the first coil pattern 21 may be formed on the insulating layer 20. A second input lead pattern and a second output lead pattern for inputting and outputting electricity to and from the second coil pattern 22 may be formed on the insulating layer 20.

At this time, the insulating layer 20 may be configured by coupling a sheet-type third insulating layer including the first and second output lead patterns with the second insulating layer in a stack type.

Further, the first coil pattern 21 and the second coil pattern 22 may be electrically connected to the first output lead pattern and the second output lead pattern through via connection structures, respectively.

Meanwhile, the upper magnetic substrate 30 and the lower magnetic substrate 10 are respectively manufactured in the form of a substrate by sintering ferrite powder of the same composition to be matched with each other and bonded to upper and lower surfaces of the insulating layer 20 including the first coil pattern 21 and the second coil pattern 22.

However, in order to implement an impedance characteristic value, the most important characteristics of the conventional common-mode filter configured as above, approximate to design values, the compositions of the upper magnetic substrate 30 and the lower magnetic substrate 10 should be uniformly mixed, but since differences in particle growth according to sintering and curing behaviors occur according to particle sizes during actual sintering, there occur phenomena such as a decrease in magnetic permeability, which locally exerts a bad effect on the impedance characteristics.

In this case, noise removal characteristics are remarkably deteriorated since it is difficult to smoothly perform removal of signal delay and noise signals due to a decrease in impedance in GHz radio-frequency bands.

Especially, the compositions of the upper magnetic substrate 30 and the lower magnetic substrate are manufactured by mixing a polymer resin in ferrite powder to increase adhesion with the insulating layer 20. In this case, although the adhesion is increased, magnetic permeability, that is, magnetic characteristics to design values of the common-mode filter is remarkably reduced due to non-uniformity of particle dispersion and mixing of the ferrite powder and the polymer resin, difficulty in rearrangement of particles according to the sintering and curing behaviors, and magnetic permeability due to the resin component during sintering. Therefore, the noise removal performance and characteristics of the product are deteriorated due to changes in resonance frequency and parasitic capacitance.

When a particle size of the ferrite constituting the upper magnetic body 30 is increased to increase permeability, radio-frequency characteristics of the common-mode filter are deteriorated, and when the amount of the resin as a binder of the upper magnetic body 30 is reduced, the adhesion, insulation, and withstand voltage characteristics of the upper magnetic body 30 are deteriorated.

Further, in order to increase permeability, there is a method of providing a high-temperature environment when forming the upper magnetic body 30, but there are problems such as deterioration of workability, increase of equipment for increasing a temperature, and deterioration of reliability of the common-mode filter in the high-temperature environment.

SUMMARY OF THE INVENTION

The present invention has been invented in order to overcome the above-described problems and it is, therefore, an object of the present invention to provide a filter for removing noise that is capable of improving performance and reliability by increasing magnetic permeability while maintaining high adhesion, insulation, and withstand voltage characteristics of an upper magnetic substrate and thus improving impedance characteristics.

It is another object of the present invention to provide a filter for removing noise that is capable of preventing an increase in manufacturing costs accompanied when increasing magnetic permeability and improving productivity by increasing magnetic permeability through simple structure and process and thus preventing an increase in equipment for improving magnetic permeability.

It is still another object of the present invention to provide a filter for removing noise that is capable of improving an effect of shielding electromagnetic waves such as jamming.

In accordance with one aspect of the present invention to achieve the object, there is provided a filter for removing noise including: a lower magnetic substrate; a coil layer disposed on the lower magnetic substrate and including at least one conductor pattern and an insulating layer covering the conductor pattern; an upper magnetic substrate disposed on the coil layer; and a magnetic permeability enhancing layer disposed on the magnetic substrate with lower magnetic permeability of the lower magnetic substrate and the upper magnetic substrate.

Here, the magnetic permeability enhancing layer may have magnetic permeability higher than that of the magnetic substrate with lower magnetic permeability of the lower magnetic substrate and the upper magnetic substrate.

And, the magnetic permeability enhancing layer may have magnetic permeability equal to that of the magnetic substrate with higher magnetic permeability of the lower magnetic substrate and the upper magnetic substrate.

As an example, the lower magnetic substrate has magnetic permeability of 80 to 150, the upper magnetic substrate has magnetic permeability of 250 to 400, and the magnetic permeability enhancing layer has magnetic permeability of 250 to 400.

Meanwhile, the upper magnetic substrate may be made of Fe, Ni, Cu, and Zn oxides.

At this time, a composition ratio of the Ni oxide and the Zn oxide may be in the range of 1:1 to 1:2.5.

And, the upper magnetic substrate may further include a resin and be manufactured by sintering.

Meanwhile, the magnetic permeability enhancing layer may be disposed on the magnetic substrate with lower magnetic permeability of the lower magnetic substrate and the upper magnetic substrate while being disposed on a surface of the magnetic substrate with lower magnetic permeability, which is in contact with the insulating layer, and inside the magnetic substrate with lower magnetic permeability in multiple layers.

The filter for removing noise in accordance with the present invention may further include a shielding enhancing layer which surrounds a laminate including the lower magnetic substrate, the coil layer, the upper magnetic layer, and the magnetic permeability enhancing layer.

Here, the shielding enhancing layer may be made of Fe, Ni, Cu, and Zn oxides or Ag, Fe, Cu, Zn, and Ni metals.

And, the shielding enhancing layer may include an inner layer made of an oxide and an outer layer made of a metal.

Meanwhile, the shielding enhancing layer may be coated through one thin-film process of chemical vapor deposition (CVD), sputtering, and electron (E)-beam and coated through a sol-gel or spray method.

And, the shielding enhancing layer may be formed with a thickness of 3 to 50 μm, and particularly, it is preferred that the shielding enhancing layer is formed with a thickness of 5 to 10 μm.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 4a and 4b are views for comparing impedance characteristics of the conventional filter for removing noise and the filter for removing noise in accordance with the present invention, wherein FIG. 4a is a graph schematically showing a change in impedance according to a frequency of the conventional filter for removing noise, and FIG. 4b is a graph schematically showing a change in impedance according to a frequency of the filter for removing noise in accordance with the present invention;

FIGS. 5a and 5b are views for comparing insertion loss characteristics of the conventional filter for removing noise and the filter for removing noise in accordance with the present invention, wherein FIG. 5a is a graph schematically showing a change in insertion loss according to a frequency of the conventional filter for removing noise, and FIG. 5b is a graph schematically showing a change in insertion loss according to a frequency of the filter for removing noise in accordance with the present invention;

DETAILED DESCRIPTION OF THE PREFERABLE EMBODIMENTS

Figure 1:
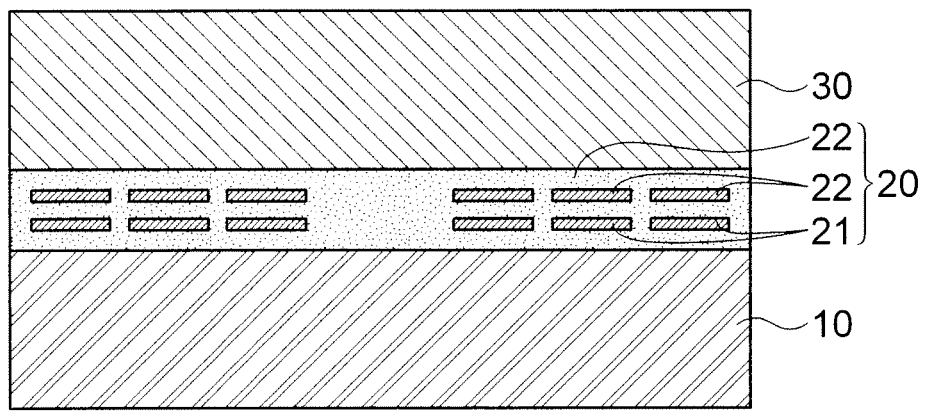
FIG. 1 is a cross-sectional view schematically showing a common-mode filter of conventional filters for removing noise.

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Further, embodiments to be described throughout the specification will be described with reference to cross-sectional views and/or plan views, which are ideal exemplary drawings of the present invention. In the drawings, the thicknesses of layers and regions may be exaggerated for the effective explanation of technical contents. Therefore, the exemplary drawings may be modified by manufacturing techniques and/or tolerances. Therefore, the embodiments of the present invention are not limited to the accompanying drawings, and can include modifications to be generated according to manufacturing processes. For example, an etched region shown at a right angle may be formed in the rounded shape or formed to have a predetermined curvature. Therefore, regions shown in the drawings have schematic characteristics. In addition, the shapes of the regions shown in the drawings exemplify specific shapes of regions in an element, and do not limit the invention.

Hereinafter, preferable embodiments of a filter for removing noise in accordance with the present invention will be described in detail with reference to FIGS. 2 to 7.

Figure 2:
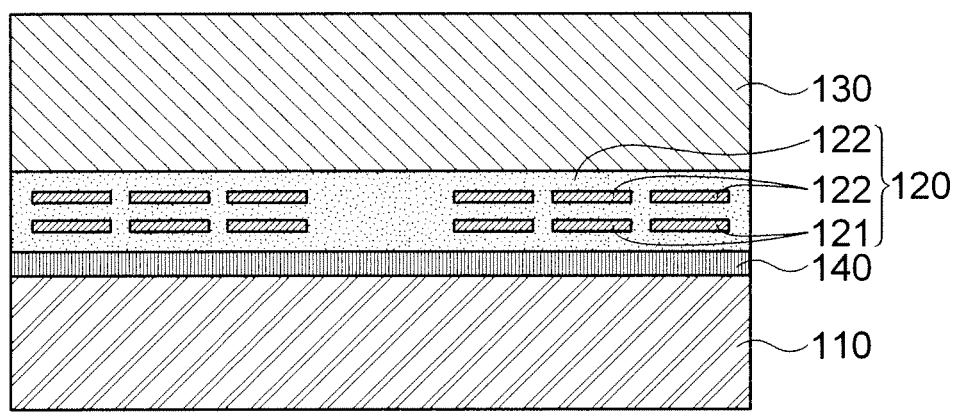
FIG. 2 is a cross-sectional view schematically showing a first embodiment of a filter for removing noise in accordance with the present invention.
Figure 3:
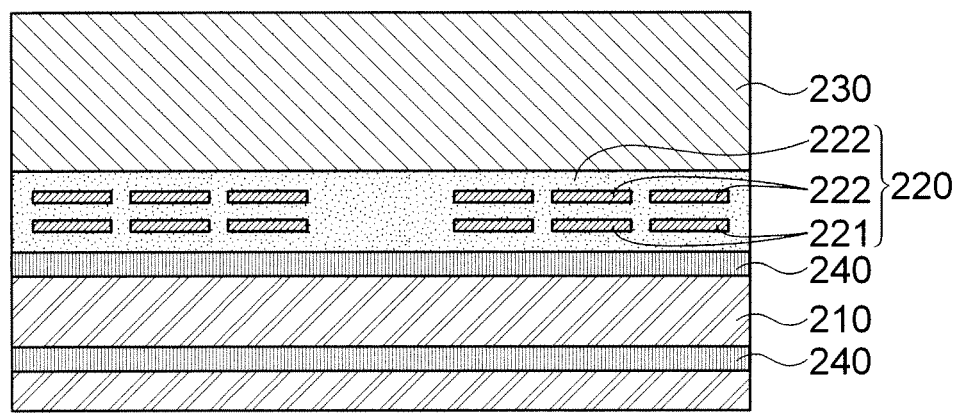
FIG. 3 is a cross-sectional view schematically showing a second embodiment of the filter for removing noise in accordance with the present invention.
Figure 4A:
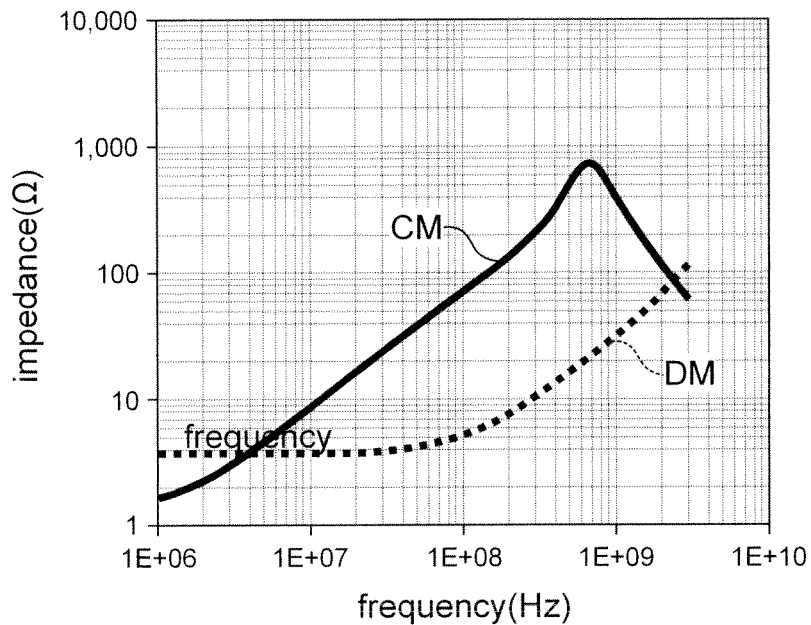
Figure 4B:
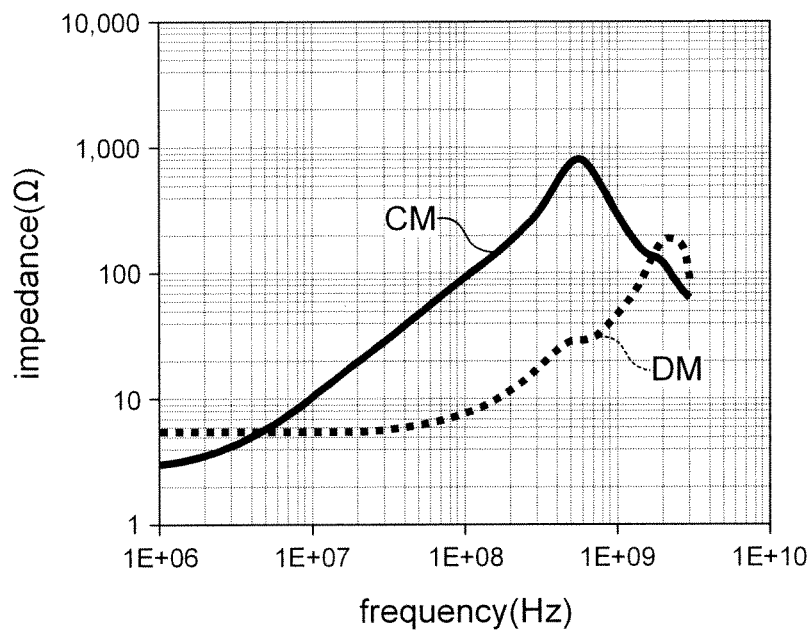
Figure 5A:
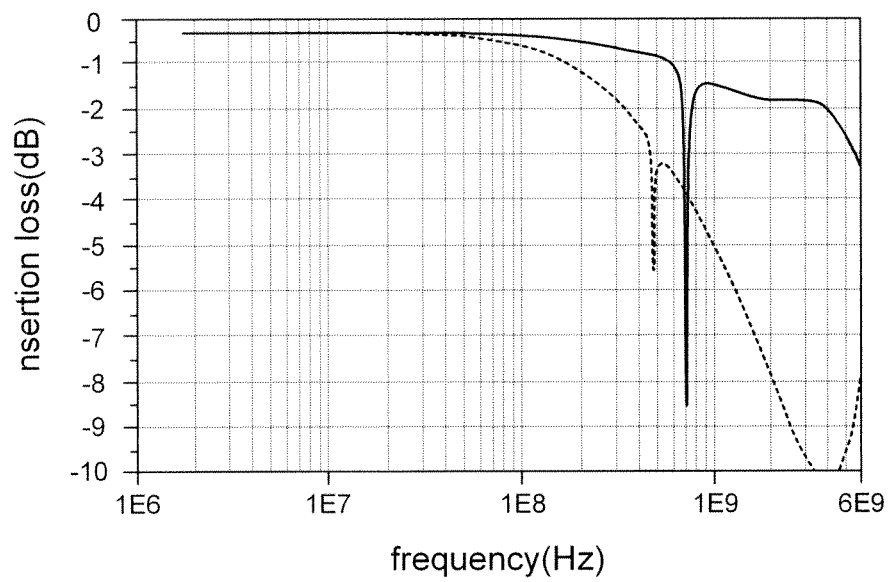
Figure 5B:
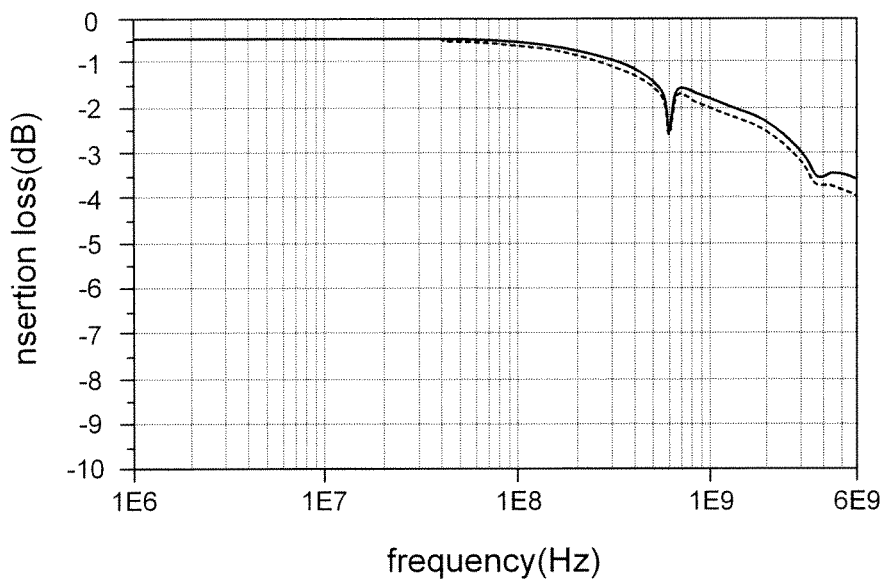

FIG. 2 is a cross-sectional view schematically showing a first embodiment of a filter for removing noise in accordance with the present invention, FIG. 3 is a cross-sectional view schematically showing a second embodiment of the filter for removing noise in accordance with the present invention, FIGS. 4a and 4b are views for comparing impedance characteristics of the conventional filter for removing noise and the filter for removing noise in accordance with the present invention, wherein FIG. 4a is a graph schematically showing a change in impedance according to a frequency of the conventional filter for removing noise, and FIG. 4b is a graph schematically showing a change in impedance according to a frequency of the filter for removing noise in accordance with the present invention, and FIGS. 5a and 5b are views for comparing insertion loss characteristics of the conventional filter for removing noise and the filter for removing noise in accordance with the present invention, wherein FIG. 5a is a graph schematically showing a change in insertion loss according to a frequency of the conventional filter for removing noise, and FIG. 5b is a graph schematically showing a change in insertion loss according to a frequency of the filter for removing noise in accordance with the present invention.

Figure 6:
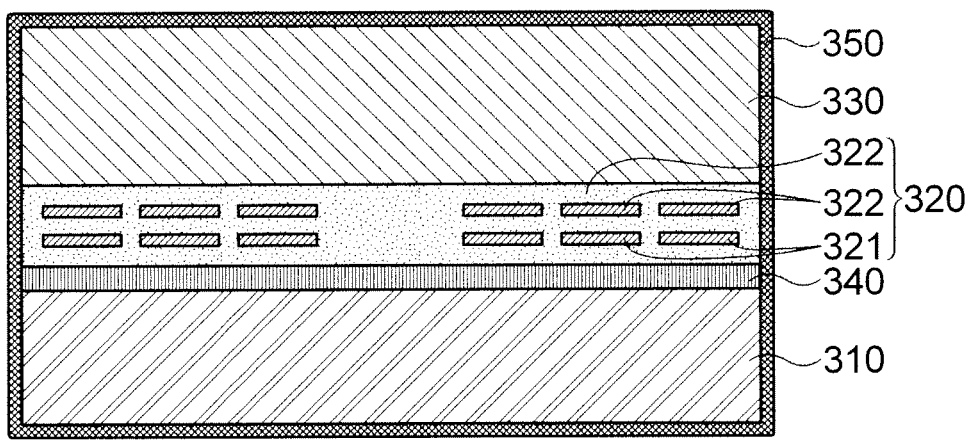
FIG. 6 is a cross-sectional view schematically showing a third embodiment of the filter for removing noise in accordance with the present invention.
Figure 7:
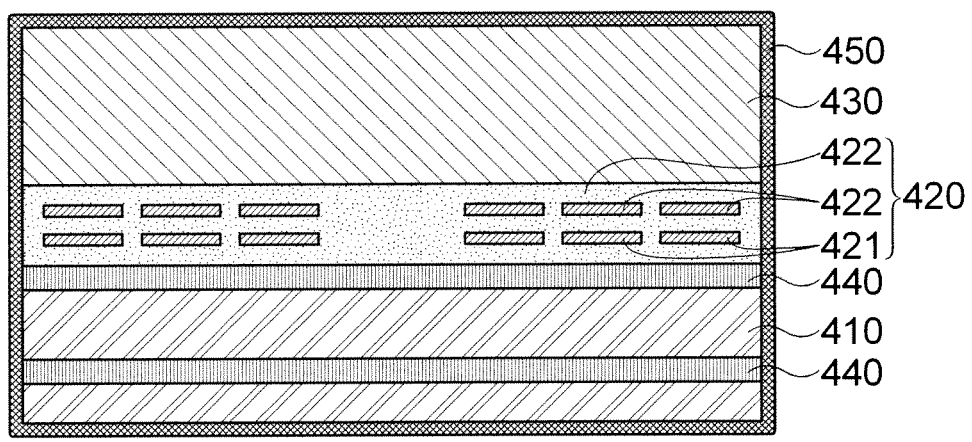
FIG. 7 is a cross-sectional view schematically showing a fourth embodiment of the filter for removing noise in accordance with the present invention.

Meanwhile, FIG. 6 is a cross-sectional view schematically showing a third embodiment of the filter for removing noise in accordance with the present invention, and FIG. 7 is a cross-sectional view schematically showing a fourth embodiment of the filter for removing noise in accordance with the present invention.

First, a first embodiment of a filter for removing noise in accordance with the present invention will be described with reference to FIG. 2 and FIGS. 4a to 5b.

Referring to FIG. 2, a first embodiment of a filter for removing noise in accordance with the present invention may include a lower magnetic substrate 110, a coil layer 120 disposed on the lower magnetic substrate 110, an upper magnetic substrate 130 disposed on the coil layer 120, and a magnetic permeability enhancing layer 140 disposed on the magnetic substrate with lower magnetic permeability of the lower magnetic substrate 110 and the upper magnetic substrate 130.

Here, the coil layer 120 may include a primary conductor pattern 121, a secondary conductor pattern 122, and an insulating layer 123 which covers the primary and secondary conductor patterns 121 and 122.

At this time, the coil layer 120 may be configured by coupling a sheet-type first insulating layer including the primary conductor pattern 121 and a sheet-type second insulating layer including the secondary conductor pattern 122 in a stack type.

And, although not shown in detail, a first input lead pattern and a first output lead pattern for inputting and outputting electricity to and from the primary conductor pattern 121 may be formed on the insulating layer 123, and a second input lead pattern and a second output lead pattern for inputting and outputting electricity to and from the secondary conductor pattern 122 may be formed on the insulating layer 123.

At this time, the coil layer 120 may be configured by coupling a sheet-type third insulating layer including the first and second output lead patterns with the second insulating layer in a stack type.

And, the lower magnetic substrate 110 and the upper magnetic substrate 130 may be bonded to upper and lower surfaces of the coil layer 120.

Meanwhile, the magnetic permeability enhancing layer 140 may have magnetic permeability higher than that of the magnetic substrate with lower magnetic permeability of the lower magnetic substrate 110 and the upper magnetic substrate 130.

Further, the magnetic permeability enhancing layer 140 may have magnetic permeability equal to that of the magnetic substrate with lower magnetic permeability of the lower magnetic substrate 110 and the upper magnetic substrate 130.

More specifically, in the filter for removing noise of this embodiment, it is disclosed that the magnetic permeability of the lower magnetic substrate 110 is lower than that of the upper magnetic substrate 130 but not limited thereto. Accordingly, in this embodiment, it is disclosed that the magnetic permeability enhancing layer 140 is disposed on the lower magnetic substrate 110.

Here, the lower magnetic substrate 110 may have magnetic permeability of 80 to 150, and the upper magnetic substrate 130 may have magnetic permeability of 250 to 400, which is higher than the magnetic permeability of the lower magnetic substrate 110. Accordingly, the magnetic permeability enhancing layer 140 may have magnetic permeability of 250 to 400, which is the same as the upper magnetic substrate 130 with relatively high magnetic permeability.

Meanwhile, the upper magnetic substrate 130 may be made of Fe, Ni, Cu, and Zn oxides.

At this time, it is preferred that a composition ratio of the Ni oxide and the Zn oxide may be in the range of 1:1 to 1:2.5.

And, the upper magnetic substrate 130 may further include a resin as well as the oxides and be manufactured by sintering.

Meanwhile, the magnetic permeability enhancing layer 140 may be disposed on a surface of the lower magnetic substrate 110, which is in contact with the coil layer 120, that is, a lower surface of the insulating layer 123.

FIGS. 4a and 4b are graphs for comparing impedance characteristics to frequencies of the conventional common-mode filter and the filter for removing noise in accordance with this embodiment. As shown in FIGS. 4a and 4b, it is possible to check that the filter for removing noise of this embodiment has high common-mode (CM) impedance and low differential-mode (DM) impedance in radio-frequency bands compared to the conventional common-mode filter.

That is, in a frequency of about 100 MHz, the CM impedance of this embodiment is 89Ω and the CM impedance of the conventional filter is 77Ω, and the DM impedance of this embodiment is 8Ω and the DM impedance of the conventional filter is 9Ω. That is, the CM impedance of this embodiment is higher than that of the conventional filter, and the DM impedance of this embodiment is lower than that of the conventional filter.

Accordingly, it is possible to check that the filter for removing noise of this embodiment has high filtering characteristics.

And, FIGS. 5a and 5b are graphs for comparing insertion loss characteristics to frequencies of the conventional common-mode filter and the filter for removing noise in accordance with this embodiment. As shown in FIGS. 5a and 5b, it is possible to check that a decrease in insertion loss in radio-frequency bands of the filter for removing noise of this embodiment is remarkably small compared to the conventional common-mode filter.

That is, it is possible to check that the insertion loss of the conventional common-mode filter is greatly decreased in the radio-frequency bands but the insertion loss of the filter for removing noise of this embodiment is slightly decreased in the radio-frequency bands.

In other words, the insertion loss of the conventional common-mode filter is suddenly decreased in the radio-frequency bands to exert a bad effect on the impedance characteristics in the end, thus causing degradation of filtering performance, but the filter for removing noise of this embodiment can prevent or minimize the degradation of the filtering performance by minimizing the decrease in the insertion loss in the radio-frequency bands and thus minimizing the bad effect on the impedance characteristics.

Next, a second embodiment of the filter for removing noise in accordance with the present invention will be described with reference to FIG. 3.

Referring to FIG. 3, a filter for removing noise of this embodiment, like the above-described first embodiment, may include a lower magnetic substrate 210, a coil layer 220 disposed on the lower magnetic substrate 210 and including a primary conductor pattern 221, a secondary conductor pattern 222, and an insulating layer 223, an upper magnetic substrate 230 disposed on the coil layer 220, and a magnetic permeability enhancing layer 240 disposed on the magnetic substrate with lower magnetic permeability of the lower magnetic substrate 210 and the upper magnetic substrate 230.

However, the filter for removing noise of this embodiment, unlike the above-described first embodiment, can increase magnetic permeability of the filter for removing noise than the above-described first embodiment by disposing the magnetic permeability enhancing layers 240 inside the magnetic substrate with lower magnetic permeability of the lower magnetic substrate 210 and the upper magnetic substrate 230, that is, the lower magnetic substrate 210 in multiple layers.

Since the above-described first embodiment can be easily applied to structure, manufacturing processes, and operation of configuration of the filter for removing noise of this embodiment except for configuration of the magnetic permeability enhancing layer 240 by those skilled in the art, detailed descriptions thereof will be omitted.

Next, a third embodiment of the filter for removing noise in accordance with the present invention will be described with reference to FIG. 6.

Referring to FIG. 6, a filter for removing noise of this embodiment, like the above-described first embodiment, may include a lower magnetic substrate 310, a coil layer 320 disposed on the lower magnetic substrate 310 and including a primary conductor pattern 321, a secondary conductor pattern 322, and an insulating layer 323, an upper magnetic substrate 330 disposed on the coil layer 320, and a magnetic permeability enhancing layer 340 disposed on the magnetic substrate with lower magnetic permeability of the lower magnetic substrate 310 and the upper magnetic substrate 330.

However, the filter for removing noise of this embodiment, unlike the above-described first embodiment, may further include a shielding enhancing layer 350 which surrounds a laminate including the lower magnetic substrate 310, the coil layer 320, the upper magnetic substrate 330, and the magnetic permeability enhancing layer 340.

Here, the shielding enhancing layer 350 may be made of Fe, Ni, Cu, and Zn oxides or Ag, Fe, Cu, Zn, and Ni metals.

And, although not shown in detail, the shielding enhancing layer 350 may be formed of a double layer including an inner layer made of an oxide and an outer layer made of a metal.

Meanwhile, the shielding enhancing layer 350 may be coated to surround the laminate through one thin-film process of chemical vapor deposition (CVD), sputtering, and E-beam or coated to surround the laminate through a sol-gel or spray method.

At this time, the shielding enhancing layer 350 may be formed with a thickness of 3 to 50 μm. Particularly, it is preferred that the shielding enhancing layer is formed with a thickness of 5 to 10 μm.

The filter for removing noise in accordance with this embodiment can prevent occurrence of malfunctions due to external noises as well as preventing the filter itself from being a noise source by preventing or minimizing leakage and external introduction of electromagnetic waves such as jamming by the shielding enhancing layer 350.

The following table 1 compares external noise shielding effects of the conventional common-mode filter and the filter for removing noise in accordance with this embodiment. As shown in the following table 1, it is possible to check that external noises introduced into the filter for removing noise of this embodiment are small compared to the conventional common-mode filter and the noises introduced from the outside are remarkably reduced particularly in the radio-frequency bands of more than GHz.

TABLE 1

| | Shielding effectiveness | |
|---|---|---|
| Frequency | The conventional CMF | This embodiment |
| 100 MHz | 10 dB | 8 dB |
| 1 GHz | 18 dB | 10 dB |
| 15 GHz | 34 dB | 15 dB |

Meanwhile, since the above-described first embodiment can be easily applied to structure, manufacturing processes, and operation of configuration of the filter for removing noise of this embodiment except for configuration of the shielding enhancing layer 350 by those skilled in the art, detailed descriptions thereof will be omitted.

Next, a fourth embodiment of the filter for removing noise in accordance with the present invention will be described with reference to FIG. 7.

Referring to FIG. 7, a filter for removing noise of this embodiment, like the above-described second embodiment, may include a lower magnetic substrate 410, a coil layer 420 disposed on the lower magnetic substrate 410 and including a primary conductor pattern 421, a secondary conductor pattern 422, and an insulating layer 423, an upper magnetic substrate 430 disposed on the coil layer 420, and a magnetic permeability enhancing layer 440 disposed on the magnetic substrate with lower permeability of the lower magnetic substrate 410 and the upper magnetic substrate 430 in multiple layers.

However, the filter for removing noise of this embodiment, unlike the above-described second embodiment, may further include a shielding enhancing layer 450 which surrounds a laminate including the lower magnetic substrate 410, the coil layer 420, the upper magnetic substrate 430, and the magnetic permeability enhancing layer 440.

Here, since the shielding enhancing layer of the above-described third embodiment can be easily applied to the shielding enhancing layer 450 of this embodiment by those skilled in the art, a detailed description thereof will be omitted.

Further, since the above-described second embodiment can be easily applied to structure, manufacturing processes, and operation of configuration of the filter for removing noise of this embodiment except for configuration of the shielding enhancing layer 450, detailed descriptions thereof will be omitted.

As described above, according to the filter for removing noise in accordance with the present invention, it is possible to improve performance and reliability of the product through improvement of impedance characteristics by disposing the magnetic permeability enhancing layer on the magnetic substrate with lower magnetic permeability of the upper magnetic substrate and the lower magnetic substrate to increase magnetic permeability.

And, according to the filter for removing noise in accordance with the present invention, it is possible to improve productivity and reduce manufacturing costs due to an increase in equipment for increasing magnetic permeability by increasing magnetic permeability through simple structure and process.

Further, according to the filter for removing noise in accordance with the present invention, it is possible to implement high performance and reliability of the product by having the shielding enhancing layer, which surrounds the laminate consisting of the lower magnetic substrate, the insulating layer including the first and second coil patterns, and the upper magnetic substrate, to improve an effect of shielding electromagnetic waves such as jamming.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments

What is claimed is:

1. A filter tor removing noise, which comprises:
   a lower magnetic substrate comprising a first single-layer structure;
   a coil layer disposed on the lower magnetic substrate and comprising at least one conductor pattern and an insulating layer covering the conductor pattern, the coil layer being configured to extend along an entire length of the lower magnetic substrate;
   an upper magnetic substrate disposed on the coil layer, the upper magnetic substrate comprising a second single-layer structure; and
   a magnetic permeability enhancing layer disposed on one of the lower magnetic substrate and the upper magnetic substrate that has a lower magnetic permeability,
   wherein a thickness of the magnetic permeability enhancing layer is thinner than one of the lower magnetic substrate and the upper magnetic substrate.

2. The filter for removing noise according to claim 1, wherein the magnetic permeability enhancing layer has magnetic permeability higher than that of the one of the lower magnetic substrate and the upper magnetic substrate that has said lower magnetic permeability.

3. The filter for removing noise according to claim 2, wherein said magnetic permeability of the magnetic permeability enhancing layer is equal to that of the one of the lower magnetic substrate and the upper magnetic substrate that has a higher magnetic permeability.

4. The filter for removing noise according to claim 2, wherein
   a range of said magnetic permeability of the lower magnetic substrate is 80 to 150,
   a range of said magnetic permeability of the upper magnetic substrate is 250 to 400, and
   a range of said magnetic permeability of the magnetic permeability enhancing layer is 250 to 400.

5. The filter for removing noise according to claim 1, wherein the upper magnetic substrate is made of Fe, Ni, Cu, and Zn oxides.

6. The filter for removing noise according to claim 5, wherein a composition ratio of the Ni oxide and the Zn oxide is in a range of 1:1 to 1:2.5.

7. The filter for removing noise according to claim 5, wherein the upper magnetic substrate further comprises a resin.

8. The filter for removing noise according to claim 1, wherein the upper magnetic substrate is manufactured by sintering.

9. The filter for removing noise according to claim 1, wherein the magnetic permeability enhancing layer is disposed on a surface of the one of the lower magnetic substrate and the upper magnetic substrate that has said lower magnetic permeability, which is in contact with the insulating layer.

10. The filter for removing noise according to claim 1, further comprising:
    a shielding enhancing layer surrounding a laminate comprising the lower magnetic substrate, the coil layer, the upper magnetic layer, and the magnetic permeability enhancing layer.

11. The filter for removing noise according to claim 10, wherein the shielding enhancing layer is made of Fe, Ni, Cu, and Zn oxides.

12. The filter for removing noise according to claim 10, wherein the shielding enhancing layer is made of Ag, Fe, Cu, Zn, and Ni metals.

13. The filter for removing noise according to claim 10, wherein the shielding enhancing layer is coated through one thin-film process of chemical vapor deposition (CVD), sputtering, and electron (E)-beam.

14. The filter for removing noise according to claim 10, wherein the shielding enhancing layer is coated through a sol-gel or spray method.

15. The filter for removing noise according to claim 10, wherein the shielding enhancing layer is fanned with a thickness of 3 to 50 μm.

16. The filter for removing noise according to claim 15, wherein the shielding enhancing layer is formed with a thickness of 5 to 10 μm.

\* \* \* \* \*